(12) United States Patent
Lee et al.

(10) Patent No.: US 9,640,774 B2
(45) Date of Patent: May 2, 2017

(54) ORGANIC LIGHT EMITTING DEVICE AND METHOD OF FABRICATING THE SAME

(71) Applicant: LG DISPLAY CO., LTD., Seoul (KR)

(72) Inventors: Heui Dong Lee, Paju-si (KR); Kwang Yeon Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/819,164

(22) Filed: Aug. 5, 2015

(65) Prior Publication Data

US 2016/0056401 A1 Feb. 25, 2016

(30) Foreign Application Priority Data

Aug. 22, 2014 (KR) .......................... 10-2014-0109783

(51) Int. Cl.
| | | |
|---|---|---|
| *H01L 51/50* | (2006.01) | |
| *C09K 11/06* | (2006.01) | |
| *H05B 33/14* | (2006.01) | |
| *H01L 27/32* | (2006.01) | |

(52) U.S. Cl.
CPC .......... *H01L 51/5016* (2013.01); *C09K 11/06* (2013.01); *H05B 33/14* (2013.01); *H01L 27/3209* (2013.01); *H01L 51/5004* (2013.01); *H01L 2251/5384* (2013.01)

(58) Field of Classification Search
CPC . H01L 51/5016; H01L 51/56; H01L 51/5036; H01L 51/5072; H01L 51/5004; H01L 51/5056; H01L 51/0072; H01L 51/0085
See application file for complete search history.

(56) References Cited

U.S. PATENT DOCUMENTS

| | | | |
|---|---|---|---|
| 2005/0249972 A1 | 11/2005 | Hatwar et al. | |
| 2013/0240851 A1* | 9/2013 | Seo | H01L 51/5262 257/40 |
| 2013/0320308 A1 | 12/2013 | Lee et al. | |
| 2014/0034936 A1* | 2/2014 | Adachi | H01L 51/0054 257/40 |
| 2014/0167013 A1 | 6/2014 | Lee et al. | |
| 2014/0197389 A1* | 7/2014 | Adamovich | H01L 51/5028 257/40 |
| 2015/0162539 A1* | 6/2015 | Lee | H01L 51/0054 257/40 |

FOREIGN PATENT DOCUMENTS

| | | |
|---|---|---|
| CN | 101170853 A | 4/2008 |
| CN | 103456761 A | 12/2013 |
| CN | 103872087 A | 6/2014 |

* cited by examiner

*Primary Examiner* — Mamadou Diallo (74) *Attorney, Agent, or Firm* — Birch, Stewart, Kolasch & Birch, LLP (57) ABSTRACT

A light emitting device is discussed, and includes a first electrode; a hole transporting layer (HTL) on the first electrode; an organic light-emission layer (EML) having a red emission layer (EML) formed in a red sub pixel area Rp, a green emission layer formed in a green sub pixel area Gp, and a blue emission layer formed in a blue sub pixel area Bp; an electron transporting layer (ETL) on the red, green and blue emission layers; and a second electrode on the electron transporting layer, wherein the green emission layer includes a phosphor host material, a second phosphor host material, and a dopant material.

23 Claims, 6 Drawing Sheets

| structure | | Volt | mA/cm² | cd/A | lm/W | CIE_x | CIE_y |
|---|---|---|---|---|---|---|---|
| green emission layer | | | | | | | |
| comparative example | first phosphor host : second phosphor host | 4.3 | 7.4 | 107.1 | 79.9 | 0.210 | 0.730 |
| embodiment | first phosphor host +third phosphor host : second phosphor host | 3.7 | 7.3 | 117.8 | 98.0 | 0.210 | 0.730 |

ORGANIC LIGHT EMITTING DEVICE AND METHOD OF FABRICATING THE SAME

CROSS REFERENCE TO RELATED APPLICATIONS

This application claims the priority benefit of the Korean Patent Application No. 10-2014-0109783 filed on Aug. 22, 2014, which is hereby incorporated by reference for all purposes as if fully set forth herein.

BACKGROUND OF THE INVENTION

Field of the Invention

The embodiments of the present invention relate to an organic light emitting device, and more particularly, to an organic light emitting device, which may be driven at a low voltage and has improved luminescence lifetime, and a method of fabricating the same.

Discussion of the Related Art

An organic light emitting display (OLED) is a self light emitting display device, and is a display device based on an organic light emitting device that injects electrons and holes from each of a cathode for electron injection and an anode for hole injection into a light emitting layer and emits light when excitons obtained by combination of the injected electrons and holes are transited from an excited state to a ground state.

The organic light emitting display may be categorized into a top emission type, a bottom emission type, and a dual emission type depending on a direction to which light is emitted, and may be categorized into a passive matrix type and an active matrix type depending on a driving mode.

The organic light emitting display may be fabricated at a lightweight and slim size as it does not need a separate light source unlike a liquid crystal display (LCD). Also, the organic light emitting display is favorable in view of power consumption due to low driving voltage and also is excellent for color realization, response speed, viewing angle, and contrast ratio (CR), whereby the organic light emitting display has been studied as a next generation display.

As a display of high resolution has been developed, the number of pixels per unit area has been increased and high luminance has been required. However, there is a limitation in luminance Cd of a unit area A in view of a luminescent structure of the organic light emitting display, and a problem occurs in that reliability of the organic light emitting device is deteriorated and power consumption is increased due to increase of an applied current.

Therefore, to overcome a technical limitation which is a factor that deteriorates quality and productivity of the organic light emitting device, it is required to improve luminescence efficiency and lifetime of the organic light emitting device and reduce power consumption. In this respect, various studies for developing an organic light emitting device, which may improve luminescence efficiency, lifetime of an organic light emitting layer and viewing angle characteristic while maintaining a color area, have been made.

An organic light emitting device (OLED) generally emits light through recombination of holes and electrons in an organic light-emission layer (EML), wherein the holes are injected from a first electrode (anode) and moved through a hole injection layer (HIL) and a hole transporting layer (HTL) and the electrons are injected from a second electrode (cathode) and moved through an electron injection layer (EIL) and an electron transporting layer (ETL).

In the organic light emitting device, to increase luminescence efficiency of the organic light emitting layer, the holes and the electrons should be injected at high density.

Also, since the organic light emitting device emits light strongly through recombination occurring at a point where the holes meet the electrons in an organic light emitting layer, not emitting light in a full area of the organic light emitting layer, its characteristic may be improved in such a manner that the recombination area is reflected in design of the organic light emitting device.

Generally, in configuring red, green and blue sub pixels in a top emission type organic light emitting device, a luminance ratio of the green sub pixels is the highest, whereby it is important to increase luminescence efficiency of a green emission layer in the organic light emitting device. As a result, studies for applying a green phosphor host material having high luminescence efficiency in comparison with the existing green fluorescent host material to the green emission layer have been made.

Also, a general method of fabricating an organic light emitting device may include a thermal evaporation method that forms a functional layer and an organic light emitting layer, which are required in the organic light emitting device, by selectively forming an organic material layer using a fine metal mask.

In the organic light emitting device fabricated by the aforementioned fine metal mask type, the organic light emitting device that includes a green emission layer to which a green phosphor host material is applied has an advantage of high luminescence efficiency but has a problem in deterioration of lifetime in comparison with the organic light emitting device that includes a green emission layer to which the existing green fluorescent host material is applied. Therefore, it is required to improve the lifetime of the organic light emitting device.

Also, in the organic light emitting device that includes a green phosphor host material, it is required to reduce power consumption through efficiency improvement and driving voltage reduction.

SUMMARY OF THE INVENTION

Accordingly, the present invention is directed to an organic light emitting device and a method of fabricating the same, which substantially obviate one or more problems due to limitations and disadvantages of the related art.

An advantage of the present invention is to provide an organic light emitting device, which may be driven at a low voltage and has improved luminescence lifetime, and a method of fabricating the same.

According to an embodiment of the present invention, provided is a light emitting device including: a first electrode; an organic light-emission layer (EML) having a red emission layer (EML) formed in a red sub pixel area Rp, a green emission layer formed in a green sub pixel area Gp, and a blue emission layer formed in a blue sub pixel area Bp, an electron transporting layer (ETL) on the red, green and blue emission layers; a second electrode on the electron transporting layer; and a capping layer (CPL), wherein the green emission layer includes a phosphor host material, a second phosphor host material, and a dopant material.

According to another embodiment of the present invention, provided is a light emitting device including: a first electrode and a second electrode; and an organic light-emission layer (EML) having a red emission layer, a green emission layer, and a blue emission layer between the first electrode and the second electrode, wherein at least one of the red emission layer, the green emission layer, and the blue emission layer emits a baseline mount of light, and further includes a plurality of organic materials generating an exciplex state of energy in an exciplex state, the plurality of organic materials emitting additional amount of light above the baseline amount of light in the exciplex state due to energy corresponding to differences of different energy levels of different kinds of the plurality of organic materials.

According to yet another embodiment of the present invention, provided is a method of manufacturing a light emitting device, the method including forming an emission layer having an exciplex material by: depositing a phosphor host material from a first deposition source onto a substrate; depositing a second phosphor host material from a second deposition source onto the substrate; and depositing a dopant material from a third deposition source onto the substrate, wherein the depositing of the phosphor host material, the second phosphor material and the dopant material occur simultaneously using a thermal evaporation method.

According to another embodiment of the present invention, provided is an organic light emitting layer including: a phosphor-based emission layer including a wide band gap material configured for exciplex generation that results in increased emission efficiency and reduced power consumption when compared to a conventional phosphor-based emission layer that lacks the wide band gap material.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Reference will now be made in detail to the exemplary embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted. In an instance where 'comprise', 'have', and 'include' described in the present specification are used, another part may be added unless 'only~' is used. The terms of a singular form may include plural forms unless referred to the contrary.

In construing an element, the element is construed as including an error or a margin range although there is no explicit description.

In description of embodiments of the present invention, when a structure (for example, an electrode, a line, a wiring, a layer, or a contact) is described as being formed at an upper portion/lower portion of another structure or on/under the other structure, this description should be construed as including an instance where the structures contact each other and moreover, an instance where a third structure is disposed therebetween.

In describing a time relationship, for example, when the temporal order is described as 'after~', 'subsequent~', 'next~', and 'before~', an instance which is not continuous may be included unless 'just' or 'direct' is used.

It will be understood that, although the terms "first", "second", etc., may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, the present invention will be described in detail with reference to the accompanying drawings.

Figure 1:
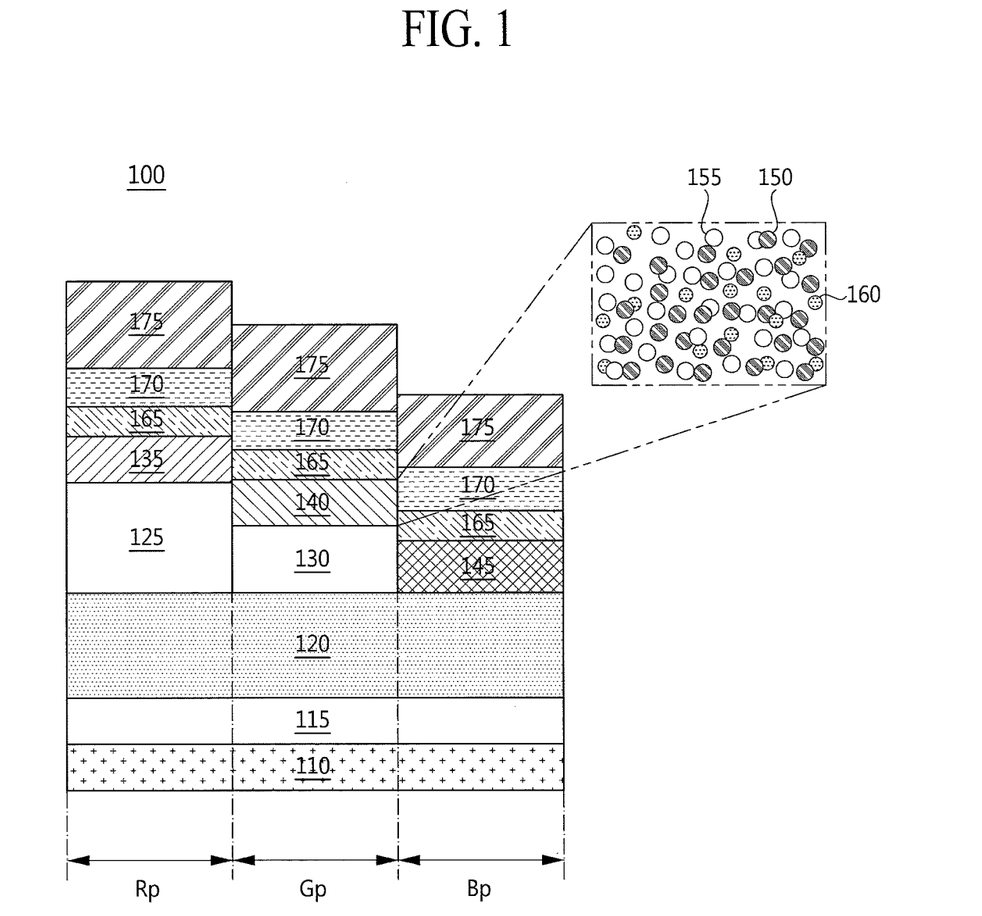
FIG. 1 is a cross-sectional view illustrating an organic light emitting device according to the embodiment of the present invention.

FIG. 1 is a cross-sectional view illustrating an organic light emitting device according to the embodiment of the present invention.

As shown in FIG. 1, the organic light emitting device 100 according to the embodiment of the present invention includes a first electrode 110 (anode) formed on a substrate in which a red sub pixel area Rp, a green sub pixel area Gp, and a blue sub pixel area Bp are defined, a hole injection layer (HIL) 115, a hole transporting layer (HTL) 120, a first optical aid layer (R-hole transporting layer (R-HTL)) 125, and a second optical aid layer (G-hole transporting layer (G-HTL)) 130.

Also, the organic light emitting device 100 according to the embodiment of the present invention includes an organic light-emission layer (EML) comprised of a red emission layer (EML) 135 formed in the red sub pixel area Rp, a green emission layer 140 formed in the green sub pixel area Gp, and a blue emission layer 145 formed in the blue sub pixel area Bp, an electron transporting layer (ETL) 165, a second electrode (cathode) 170, and a capping layer (CPL) 175.

Also, in an organic light emitting display that includes the organic light emitting device, a power line is arranged to be extended in parallel with any one of gate and data lines, which cross each other on the substrate to define each pixel area, and a switching thin film transistor and a driving thin film transistor are arranged in each pixel area, wherein the switching thin film transistor is connected to the gate line and the data line, and the driving thin film transistor is connected to the switching thin film transistor. The driving thin film transistor is connected to the first electrode 110.

The first electrode 110 is formed at the red sub pixel area Rp, the green sub pixel area Gp and the blue sub pixel area Bp on the substrate, and may be formed as a reflective electrode. For example, the first electrode 110 may include a transparent conductive material layer having a high work function such as indium-tin-oxide (ITO) and a reflective material layer such as Ag or Ag alloy.

The hole injection layer (HIL) 115 is formed on the first electrode 110 to correspond to all of the red sub pixel area Rp, the green sub pixel area Gp and the blue sub pixel area Bp.

The hole injection layer 115 may serve to actively inject holes, and may be made of, but not limited to, one or more selected from a group of HATCN, CuPc (cupper phthalocyanine), PEDOT (poly(3,4)-ethylenedioxythiophene), PANI (polyaniline) and NPD (N,N-dinaphthyl-N,N'-diphenylbenzidine).

The hole injection layer 115 may be formed in such a manner that a p type dopant (p-dopant) is added to a material constituting the hole transporting layer 120. In this instance, the hole injection layer 115 and the hole transporting layer 120 may be formed by a continuous process in one process equipment.

The hole transporting layer (HTL) 120 is formed on the hole injection layer 115. The hole transporting layer 120 serves to actively transport holes to a common hole transporting layer (HTL) corresponding to all of the red sub pixel area Rp, the green sub pixel area Gp and the blue sub pixel area Bp, and may be made of, but not limited to, one or more selected from a group of NPD (N,N-dinaphthyl-N,N'-diphenylbenzidine), TPD (N,N'-bis-(3-methylphenyl)-N,N'-bis-(phenyl)-benzidine), s-TAD and MTDATA (4,4',4"-Tris(N-3-methylphenyl-N-phenyl-amino)-triphenylamine).

The first optical aid layer 125 and the second optical aid layer 130 are arranged on the hole transporting layer 120 and respectively formed to correspond to the red sub pixel area Rp and the green sub pixel area Gp.

The first optical aid layer 125 serves as a first R-hole transporting layer (R-HTL) formed at the red sub pixel area Rp, and is formed at the red sub pixel area Rp to form an optical distance of micro cavity.

Also, the second optical aid layer 130 serves as a second G-hole transporting layer (G-HTL) formed at the green sub pixel area Gp, and is formed at the green sub pixel area Gp to form an optical distance of micro cavity.

Each of the first optical aid layer 125 and the second optical aid layer 130 serves to actively transport holes, and may be made of, but not limited to, any one or more selected from a group of NPD (N,N-dinaphthyl-N,N'-diphenylbenzidine), TPD (N,N'-bis-(3-methylphenyl)-N,N'-bis-(phenyl)-benzidine), s-TAD and MTDATA (4,4',4"-Tris(N-3-methylphenyl-N-phenyl-amino)-triphenylamine).

Also, an electron blocking layer (EBL) may be formed on the first optical aid layer (R-HTL) 125 and the second optical aid layer (G-HTL) 130. The electron blocking layer EBL serves to actively make recombination of holes and electrons within the organic light emitting layer by avoiding a flow of electrons to the hole transporting layer 120, thereby improving luminescence efficiency of the organic light emitting device.

The red emission layer (Red EML) 135 is formed on the first optical aid layer (R-HTL) 125, and the green emission layer (Green EML) 140 is formed on the second optical aid layer (G-HTL) 130. Also, the blue emission layer (Blue EML) 145 is formed on the hole transporting layer 120 where the first optical aid layer (R-HTL) 125 and the second optical aid layer (G-HTL) 130 are not formed.

The red emission layer 135, the green emission layer 140 and the blue emission layer 145 are respectively arranged on the red sub pixel area Rp, the green sub pixel area Gp and the blue sub pixel area Bp, and may include materials for respectively emitting red, green and blue and may be formed using a phosphor material or fluorescent material.

The red emission layer 135 includes a host material that contains CBP (carbazole biphenyl) or mCP (1,3-bis(carbazol-9-yl), and may be made of, but not limited to, a phosphor material that includes a dopant that contains any one or more selected from a group of PIQIr(acac)(bis(1-phenylisoquinoline) acetylacetonate iridium), PQIr(acac)(bis(1-phenylquinoline) acetylacetonate iridium), PQIr(tris(1-phenylquinoline) iridium) and PtOEP (octaethylporphyrin platinum), or may be made of, but not limited to, a fluorescent material that includes PBD:Eu(DBM)3(Phen) or Perylene.

The green emission layer 140 may be made of, but not limited to, a plurality of different kinds of phosphor materials selected from TCTA (Tris(4-carbazoyl-9-ylphenyl) amine), CBP (4,4'-Bis(N-carbazolyl)-1,1'-biphenyl), Balq (Bis(8-hydroxy-2-methylquinoline)-(4-phenylphenoxy)aluminum) and PPV (poly(p phenylene vinylene)), as host materials.

Also, referring to FIG. 1, the green emission layer 140 of the organic light emitting device 100 according to the embodiment of the present invention may include a phosphor host material 150, a second phosphor host material 155, and a dopant material 160, wherein the phosphor material 150 has a pre-mixed state of a first phosphor host material and a third phosphor host material having a band gap wider than those of the first phosphor host material and the second phosphor host material.

Also, when considering an aspect of a process of forming the green emission layer 140 on the substrate through deposition, it is preferable that a pre-mixed ratio of the host material 150 obtained by pre-mixture of the first phosphor host material and the third phosphor host material having the wider band gap is in the range of 3:1 or 1:3 so as not to generate non-uniform deposition of the host material of the green emission layer 140, which may occur if there is a big difference in a mixture ratio of the first phosphor host material and the third phosphor host material within one deposition source, or non-uniform deposition of the host material of the green emission layer 140, which may occur due to a difference in a deposition distance between each of a plurality of deposition sources and the substrate.

In FIG. 1, the dopant doped in the green emission layer 140 may be made of, but not limited to, phosphor materials such as Ir complex containing Ir(ppy)3 or Ir(mmapy)3.

In an instance of a doping concentration of the dopant in the green emission layer, if the doping concentration becomes high, the dopant acts as a trap site within the green emission layer 140, whereby efficiency may be reduced when the green emission layer 140 emits light. Therefore, the phosphor dopant in the green emission layer 140 may be doped at a concentration level of 3 to 20%, more preferably 5 to 10%.

Also, when considering an aspect of control of an optical distance of the organic light emitting device and an aspect of a driving voltage increased as a thickness of the green emission layer 140 is increased, it is preferable that the green emission layer 140 is formed at a thickness of 200 Å to 500 Å.

The blue emission layer 145 includes a host material that contains CBP or mCP, and may be made of a phosphor material that includes a dopant material that contains (4,6-F2ppy)2Irpic. Unlike the above material, the blue emission layer 145 may be made of, but not limited to, a fluorescent material that includes any one selected from a group of spiro-DPVBi, spiro-6P, distilbenzene (DSB), distrilarylene (DSA), PFO based high polymer, and PPV based high polymer.

The electron transporting layer 165 is formed on the red emission layer 135, the green emission layer 140 and the blue emission layer 145. The thickness of the electron transporting layer 165 may be controlled considering electron transporting characteristic. Also, the electron transporting layer 165 may serve to transport and inject electrons.

The electron transporting layer 165 serves to actively transport electrons, and may be made of, but not limited to, any one or more selected from a group of Alq3 (tris(8-hydroxyquinolino)aluminum), PBD, TAZ, spiro-PBD, BAlq, Liq (lithium quinolate), BMB-3T, PF-6P, TPBI, COT and SAlq.

In FIG. 1, the electron injection layer (EIL) may separately be formed on the electron transporting layer 165.

The electron injection layer (EIL) may be made of, but not limited to, Alq3(tris(8-hydroxyquinolino)aluminum), PBD, TAZ, spiro-PBD, BAlq, or SAlq.

In this instance, the structure of the organic light emitting device is not limited to the embodiment of the present invention, and at least one of the hole injection layer 115, the hole transporting layer 120, the first optical aid layer 125, the second optical aid layer 130, the electron transporting layer 165, and the electron injection layer (EIL) may be omitted.

Also, each of the hole injection layer 115, the hole transporting layer 120, the first optical aid layer 125, the second optical aid layer 130, the electron transporting layer 165 and the electron injection layer EIL may be formed of two or more layers.

The second electrode 170 is formed on the electron transporting layer 165. For example, the second electrode 170 may be made of Ag or alloy (Ag:Mg) of Ag and Mg, and may have transflective characteristic. That is, light emitted from the organic light emitting layer is displayed externally through the second electrode 170, and some of the light is again emitted toward the first electrode 110 as the second electrode 170 has transflective characteristic.

In this way, repetitive reflection occurs between the first electrode 110 and the second electrode 170, which act as reflective layers, and light is repeatedly reflected between the first electrode 110 and the second electrode 170 by micro cavity caused by repetitive reflection, whereby light efficiency is increased.

In addition, the first electrode 110 may be formed as a transmissive electrode, and the second electrode 170 may be formed as a reflective electrode, whereby the light from the organic light emitting layer may be displayed externally through the first electrode 110.

The capping layer 175 is formed on the second electrode 170. The capping layer 175 is intended to increase an optical extraction effect, and may be made of any one of the material of the hole transporting layer 120, the first optical aid layer 125, the second optical aid layer 130 and the electron transporting layer 165, and the host material of the red emission layer 135, the green emission layer 140 and the blue emission layer 145. Also, the capping layer 175 may be omitted.

Figure 2:
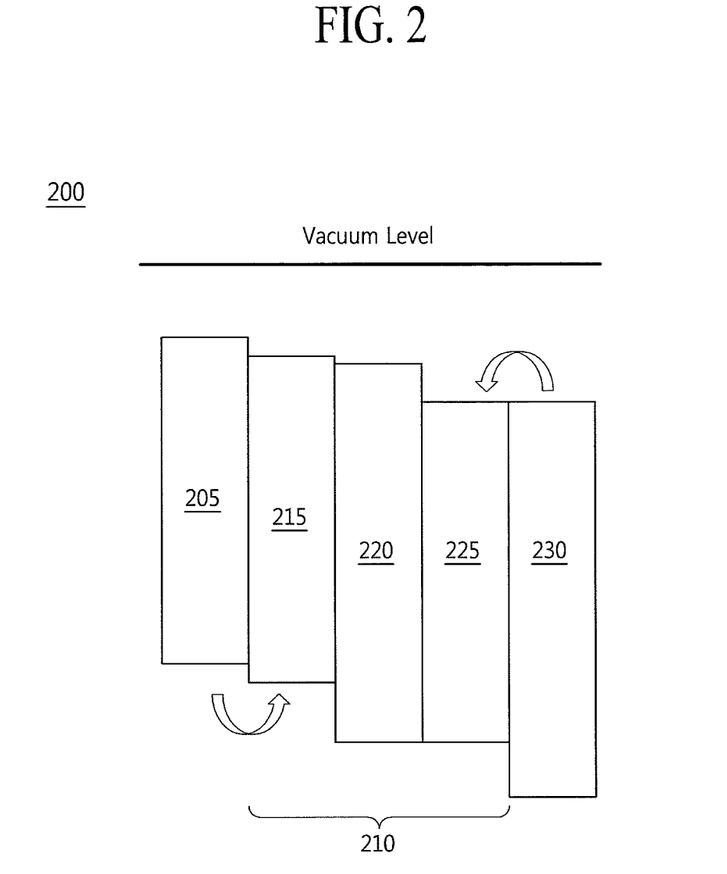
FIG. 2 is a view illustrating an energy band diagram of a host material of a green emission layer of an organic light emitting device according to the embodiment of the present invention.

FIG. 2 is a view illustrating an energy band diagram 200 of a host material of a green emission layer 140 of an organic light emitting device 100 according to the embodiment of the present invention, which is described with reference to FIG. 1.

In more detail, FIG. 2 illustrates an energy band diagram of a hole transporting layer 205 and an electron transporting layer 230, which are adjacent to a plurality of phosphor host materials 215, 220 and 225 of the green emission layer 210 of the organic light emitting device 100 according to the embodiment of the present invention.

Referring to FIG. 2, the green emission layer 210 of the organic light emitting device according to the embodiment of the present invention includes a first phosphor host material 215, a third phosphor host material 220 having a wide band gap, and a second phosphor host material 225.

It is preferable that a Highest Occupied Molecular Orbital (HOMO) energy level of the first phosphor host material 215, the third phosphor host material 220, and the second phosphor host material 225, which are included in the green emission layer 210, has a value between HOMO energy level of the hole transporting layer 205 and HOMO energy level of the electron transporting layer 230, whereby injection of holes may be performed actively.

Also, in view of a Lowest Unoccupied Molecular Orbital (LUMO) energy level, it is preferable that a LUMO energy level of the first phosphor host material 215 and a LUMO energy level of the hole transporting layer 205 are similar to each other and that a LUMO energy level of the second phosphor host material 225 and a LUMO energy level of the electron transporting layer 230 are similar to each other, whereby injection of electrons may be performed actively.

Also, it is preferable that a LUMO energy level of the third phosphor host material 220 having a wide band gap has a value between the LUMO energy level of the first phosphor host material 215 and the LUMO energy level of the second phosphor host material 225, and it is also preferable that the HOMO energy level of the third phosphor host material 220 having a wide band gap has a value similar to the HOMO energy level of the second phosphor material 225 to have the widest band gap as compared with the other phosphor host materials included in the green emission layer 210.

As the third phosphor host material 220 having a band gap wider than those of the first phosphor host material 215 and the second phosphor material 225 may be applied to the green emission layer of the organic light emitting device according to the embodiment of the present invention, holes and electrons may be injected into the green emission layer 210 more actively, whereby luminescence efficiency of the green emission layer 210 may be improved.

Figure 3:
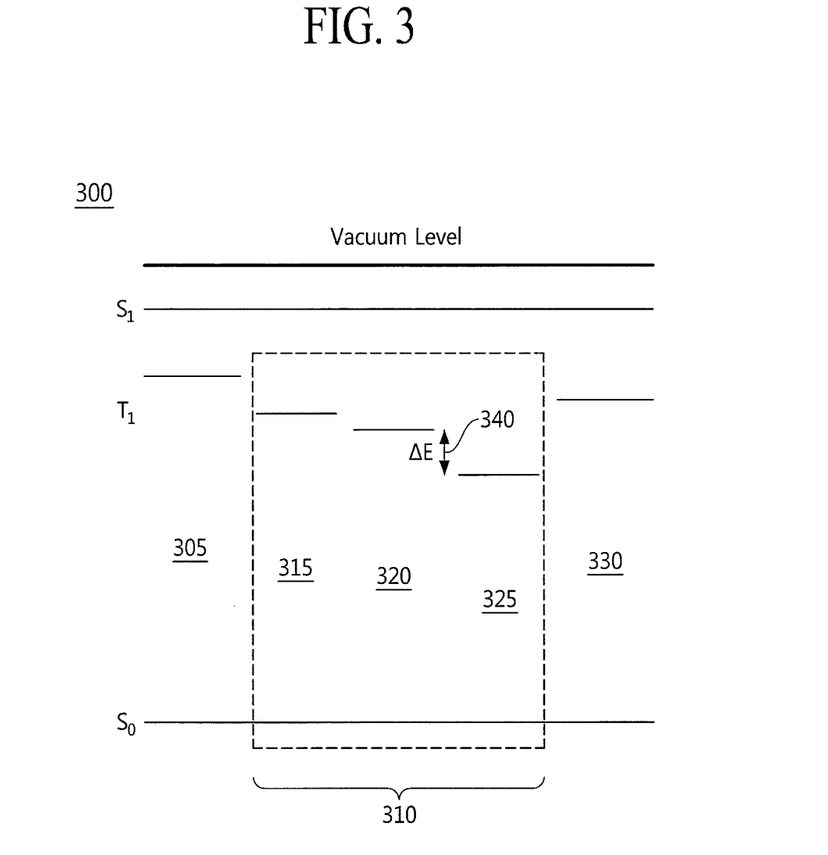
FIG. 3 is a view illustrating a triplet energy level of a host material of a green emission layer of an organic light emitting device according to the embodiment of the present invention.

FIG. 3 is a view illustrating a triplet energy level of a host material of a green emission layer 140 of an organic light emitting device 100 according to the embodiment of the present invention, which is described in FIG. 1.

Luminescence means that a material receives energy by means of electromagnetic waves, heat and friction, is excited by the received energy and emits light of a specific wavelength. In an instance of the organic light emitting device, a luminescent material of the organic light emitting layer becomes an excited state S1 by means of energy obtained by combination of electrons and holes, and light is emitted when the excited state S1 again returns to a ground state S0.

Luminescence returning from the excited state S1, that is, a singlet energy level to the ground state S0 will be referred to as fluorescence, and luminescence returning from the excited state S1 to the ground state S0 through a triplet energy level T1 which is relatively low will be referred to as phosphorescence.

Referring to FIG. 3, a green emission layer 310 of the organic light emitting device according to the embodiment of the present invention includes a first phosphor host material 315, a third phosphor material 320, and a second phosphor host material 325. Also, the third phosphor material 320 has a band gap wider than those of the first phosphor host material 215 and the second phosphor host material 225.

In view of a triplet energy level T1 of the green emission layer 310 of the organic light emitting device according to the embodiment of the present invention, to prevent the exciton from being emitted and disappearing within the green emission layer 310, it is preferable that the first phosphor host material 315, the third phosphor material 320 having a wider band gap, and the second phosphor host material 325 have the triplet energy level T1 lower than those of the hole transporting layer 305 and the electron transporting layer 330.

Also, in an instance of the green emission layer 310 of the organic light emitting device according to the embodiment of the present invention, a difference ΔE 340 of a certain level may occur between the triplet energy level T1 of the first phosphor host material 315 and the third phosphor material 320 and the triplet energy level T1 of the second phosphor host material 325, whereby an excited state complex (exciplex) state may be formed.

The exciplex state is generated by different energy E values owned by different kinds of organic materials within the organic light emitting layer, and luminescence may occur due to energy corresponding to a difference of the different energy levels. Therefore, the triplet energy levels T1 of the plurality of phosphor host materials included in the organic light emitting layer may be controlled to improve luminescence efficiency through luminescence based on the exciplex state.

The triplet energy level T1 of the third phosphor material 320 having a wider band gap and the first phosphor host material 315 in the organic light emitting device 100 according to the embodiment of the present invention has a difference ΔE 340 of an energy level of 0.04 eV to 0.1 eV in comparison with the triplet energy level T1 of the second phosphor host material 325, whereby the exciplex state may be formed within the green emission layer 310. In embodiments of the present invention, the green emission layer 310 may emit a baseline amount of light, or have a baseline luminance. Then, when an exciplex state is generated by the different energy E values owned by the different kinds of organic materials within the organic light emitting layer, the plurality of organic materials emit additional amount of light above the baseline amount of light in the exciplex state due to energy corresponding to the differences of the different energy levels of the different kinds of the plurality of organic materials. In embodiments of the present invention, the emission layer that forms the exciplex state need not be limited to the green emission layer 310, so that other emission layers, including the red emission layer 135 and the blue emission layer 145 may also form the exciplex state.

As described above, the third phosphor material 320 having a wider band gap may be applied to the green emission layer 310 of the light emitting device to form the exciplex state, whereby luminescence efficiency of the green emission layer 310 of the organic light emitting device may be increased and the driving voltage may be reduced.

Figure 4:
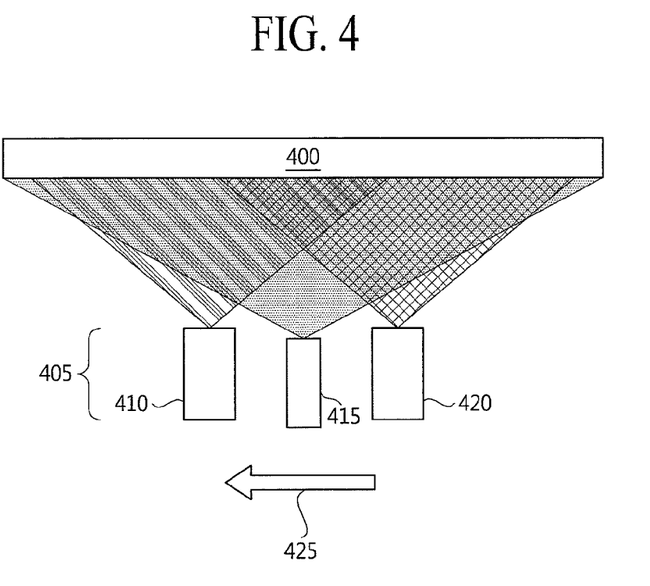
FIG. 4 is a view illustrating a method of forming a green emission layer of an organic light emitting device according to the embodiment of the present invention.

FIG. 4 is a view illustrating a method of forming a green emission layer 140 of an organic light emitting device 100 according to the embodiment of the present invention, which is described in FIG. 1.

Referring to FIG. 4, a device for forming the green emission layer 140 of the organic light emitting device 100 according to the embodiment of the present invention includes a deposition source 405 that includes first and second deposition sources 410 and 420 for depositing a green phosphor host material on a substrate 400 and a third deposition source 415 for depositing a green phosphor dopant material on the substrate 400.

The first deposition source 410 is provided with a first phosphor host material and a third phosphor host material, which are formed in a pre-mixed state, wherein the third phosphor host material has a band gap wider than those of the first phosphor host material and the second phosphor host material. As the first deposition source 410 is moved in one direction 425 shown in FIG. 4 with respect to the substrate 400 of which position is fixed, the first phosphor host material and the third phosphor host material having a wider band gap are formed on the substrate 400 by a thermal evaporation method.

Also, the second deposition source 420 is provided with a second phosphor host material, and as the second deposition source 420 is moved in one direction 425 shown in FIG. 4 with respect to the substrate 400 of which position is fixed, simultaneously with the first deposition source 410, the second phosphor host material is deposited on the substrate 400 by a thermal evaporation method.

Also, the third deposition source 415 is provided with a green phosphor dopant material, and as the third deposition source 415 is moved in one direction 425 shown in FIG. 4 with respect to the substrate 400 of which position is fixed, simultaneously with the first and second deposition sources 410 and 420, the green phosphor dopant material is deposited on the substrate 400 by a thermal evaporation method.

In this way, the first deposition source 410, the second deposition source 420 and the third deposition source 415 are once scanned in one direction 425 with respect to the substrate 400 of which position is fixed, whereby the green emission layer that includes the first phosphor host material and the third phosphor host material of the pre-mixed state, the second phosphor host material and the phosphor dopant material may be formed in the organic light emitting device 100 according to the embodiment of the present invention. Also, the third phosphor host material has a band gap wider than those of the first phosphor host material and the second phosphor host material.

Figure 5:
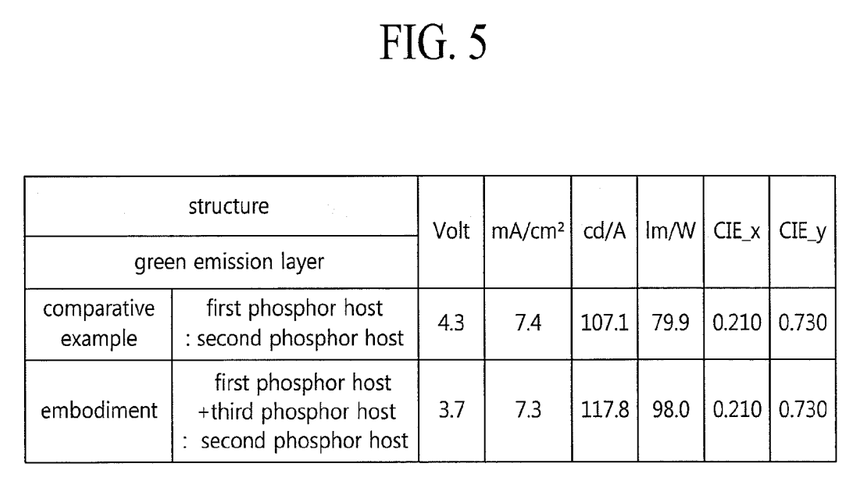
FIG. 5 is a view illustrating a result of electro-optic characteristic evaluation of an organic light emitting device according to the embodiment of the present invention.

FIG. 5 is a view illustrating a result of electro-optic characteristic evaluation of an organic light emitting device according to the embodiment of the present invention.

FIG. 5 illustrates the result obtained by comparing a driving voltage V, driving current density mA/cm$^2$, luminescence efficiency cd/A, power efficiency lm/W, and color coordinates CIE_x, CIE_y of the organic light emitting device according to the embodiment of the present invention with those of a comparative example and evaluating them.

The comparative example illustrates the result obtained by evaluation of electro-optic characteristic of an organic light emitting device that includes a phosphor green emission layer formed by mixture of a first phosphor host material and a second phosphor host material.

Also, the embodiment of the present invention illustrates the result obtained by evaluation of electro-optic characteristic of an organic light emitting device that includes a phosphor green emission layer formed by mixture of a phosphor host material and a second phosphor host material, wherein the phosphor host material is obtained by pre-mixing a first phosphor host material and a third phosphor host material.

Driving voltage characteristics of organic light emitting devices according to the comparative example and the embodiment of the present invention will be described with reference to FIG. 5. It is noted that the organic light emitting device according to the comparative example has a driving voltage of 4.3V, whereas the organic light emitting device according to the embodiment of the present invention has a driving voltage of 3.7V. The driving voltage of the organic light emitting device according to the embodiment of the present invention has been reduced to 0.6V approximately in comparison with the comparative example, thereby obtaining the improved result in view of the driving voltage.

Also, in view of green luminescence efficiency, the organic light emitting device according to the comparative example has green luminescence efficiency of 107.1 cd/A, whereas the organic light emitting device according to the embodiment of the present invention has green luminescence efficiency of 117.8 cd/A. As a result, the green luminescence efficiency of the organic light emitting device according to the embodiment of the present invention has been increased to 10.7 cd/A approximately in comparison with the comparative example, thereby resulting in the improved green luminescence efficiency.

Based on the above results, the organic light emitting device according to the embodiment of the present invention, which includes the phosphor green emission layer formed by mixing the phosphor host material, in which the first phosphor host material and the third phosphor host material having a wider band gap are pre-mixed, with the second phosphor host material, may reduce power consumption by reducing the driving voltage, and may obtain improved picture quality by increasing green luminescence efficiency.

Figure 6:
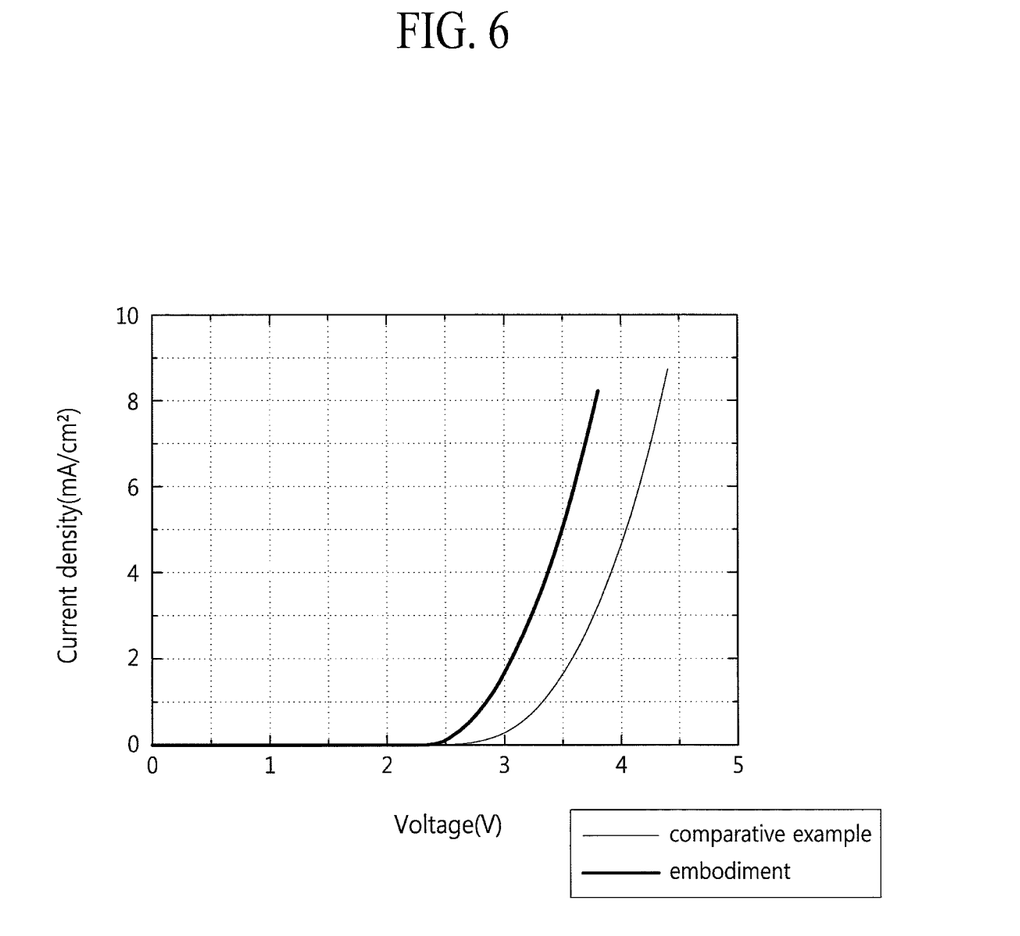
FIG. 6 is a view illustrating a result of driving voltage evaluation of an organic light emitting device according to the embodiment of the present invention.

FIG. 6 is a view illustrating a result of driving voltage evaluation of an organic light emitting device according to the embodiment of the present invention.

In FIG. 6, a comparative example illustrates a result of driving voltage evaluation of an organic light emitting device that includes a phosphor green emission layer formed by mixture of a first phosphor host material and a second phosphor host material.

Also, in FIG. 6, the embodiment according to the present invention illustrates a result of driving voltage evaluation of an organic light emitting device that includes a phosphor green emission layer formed by mixture of a phosphor host material and a second phosphor host material, wherein the phosphor host material is obtained by pre-mixing the first phosphor host material with the third phosphor host material having a band gap wider than those of the first phosphor host material and the second phosphor host material.

A driving current density mA/cm$^2$ based on a driving voltage V of organic light emitting devices according to the comparative example and the embodiment of the present invention will be described with reference to FIG. 6. As shown in FIG. 6, it is noted that the comparative example requires a driving voltage of 4.3V to generate a driving current density of 7.4 mA/cm$^2$, whereas the embodiment of the present invention requires a driving voltage of 3.7V to generate a driving current density of 7.3 mA/cm$^2$. It is noted that the organic light emitting device according to the embodiment of the present invention may be driven by a lower driving voltage than that of the comparative example.

That is, as the organic light emitting device according to the embodiment of the present invention includes a phosphor green emission layer formed by mixture of the phosphor host material and the second phosphor host material, wherein the phosphor host material is obtained by pre-mixing the first phosphor host material with the third phosphor host material having a wider band gap, the driving voltage may be reduced, whereby power consumption in the organic light emitting device may be reduced.

Figure 7:
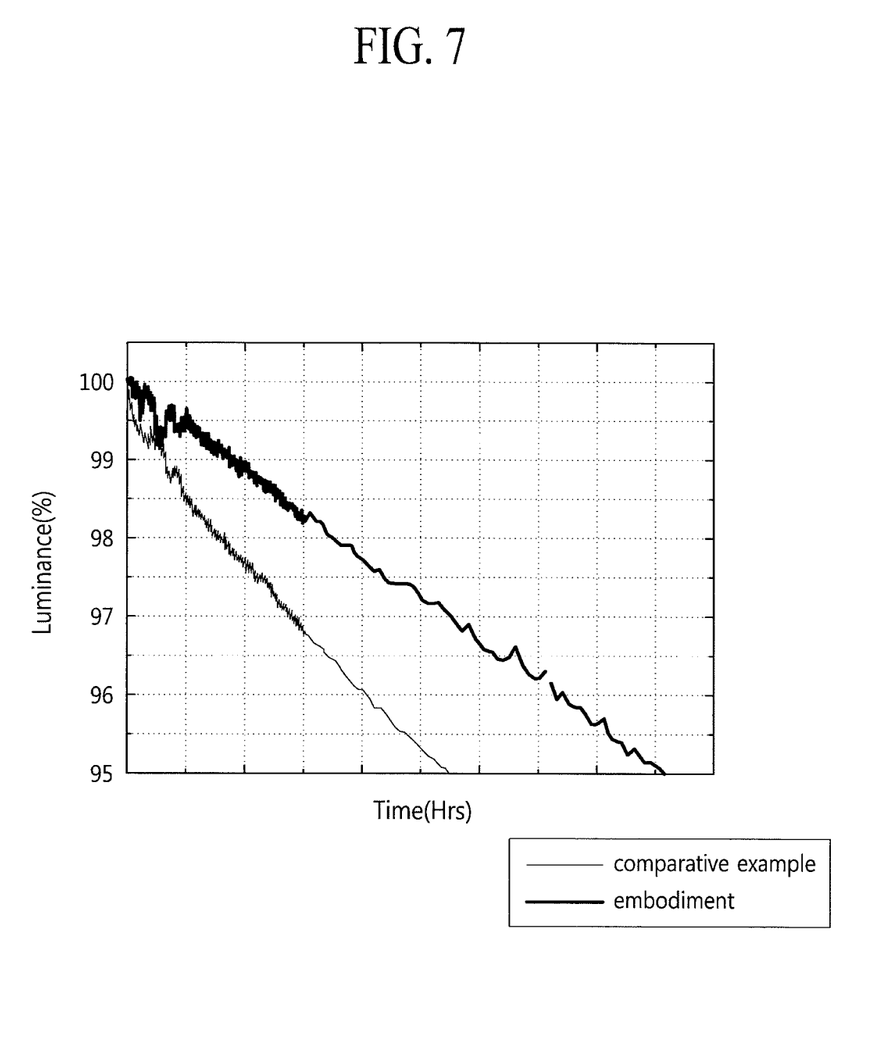
FIG. 7 is a view illustrating a result of lifetime evaluation of an organic light emitting device according to the embodiment of the present invention.

FIG. 7 is a view illustrating a result of lifetime evaluation of an organic light emitting device according to the embodiment of the present invention.

In FIG. 7, a comparative example illustrates a result of lifetime of an organic light emitting device that includes a phosphor green emission layer formed by mixture of a first phosphor host material and a second phosphor host material.

Also, in FIG. 7, the embodiment according to the present invention illustrates a result of lifetime of an organic light emitting device that includes a phosphor green emission layer formed by mixture of a phosphor host material and a second phosphor host material, wherein the phosphor host material is obtained by pre-mixing the first phosphor host material with the third phosphor host material having a band gap wider than those of the first phosphor host material and the second phosphor host material.

A lifetime of an organic light emitting device according to the comparative example from initial luminescence luminance to luminescence luminance corresponding to 95% of initial luminescence luminance will be compared with a lifetime of an organic light emitting device according to the embodiment of the present invention from initial luminescence luminance to luminescence luminance corresponding to 95% of initial luminescence luminance with reference to FIG. 7. It is noted that the lifetime of the organic light emitting device according to the embodiment of the present invention has been improved to 67% approximately in comparison with the comparative example.

That is, in the organic light emitting device according to the embodiment of the present invention includes a phosphor green emission layer formed by mixture of the phosphor host material and the second phosphor host material, wherein the phosphor host material is obtained by pre-mixing the first phosphor host material with the third phosphor host material having a wider band gap, the lifetime of the organic light emitting device according to the embodiment of the present invention has been increased in comparison with the organic light emitting device of the comparative example to which the phosphor host material having a wider band gap is not applied.

According to another embodiment of the present invention, provided is an organic light emitting layer including: a phosphor-based emission layer including a wide band gap material configured for exciplex generation that results in increased emission efficiency and reduced power consumption when compared to a conventional phosphor-based emission layer that lacks the wide band gap material.

The phosphor-based emission layer includes a first phosphor host material, a second phosphor host material and a third phosphor host material, wherein the third phosphor host material is made of a wide band gap material.

The third phosphor host material has a LUMO level between a LUMO level of the first phosphor host material and a LUMO level of the second phosphor host material.

A triplet energy level T1 of each of the first phosphor host material and the third phosphor host material have a difference 0.04 eV to 0.1 eV as compared with a triplet energy level T1 of the second phosphor host material.

The first phosphor host material and the third phosphor host material are pre-mixed with each other.

According to the present invention, the following advantages may be obtained.

As the first phosphor host material and the third phosphor material having a wider band gap, which are pre-mixed with each other, and the second phosphor material may be applied to the green emission layer of the organic light emitting device according to the embodiment of the present invention, the driving voltage of the organic light emitting device may be reduced, whereby power consumption of the organic light emitting device may be reduced.

In addition, luminescence efficiency of the green emission layer of the organic light emitting device may be improved by application of the third phosphor host material having a wider band gap to the green emission layer, whereby lifetime of the organic light emitting device may be improved.

In addition, a phosphor-based emission layer including a wide band gap material configured for exciplex generation that results in increased emission efficiency and reduced power consumption when compared to a conventional phosphor-based emission layer that lacks the wide band gap material.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:
1. A light emitting device comprising:
a first electrode;
a hole transporting layer (HTL) on the first electrode;
an organic light-emission layer (EML) having a red emission layer (EML) formed in a red sub pixel area Rp, a green emission layer formed in a green sub pixel area Gp, and a blue emission layer formed in a blue sub pixel area Bp;
an electron transporting layer (ETL) on the red, green and blue emission layers; and
a second electrode on the electron transporting layer,
wherein the green emission layer includes a phosphor host material, a second phosphor host material, and a dopant material.

2. The light emitting device of claim 1, wherein the phosphor host material has a pre-mixed state of a first phosphor host material and a third phosphor host material having a band gap wider than those of the first phosphor host material and the second phosphor host material.

3. The light emitting device of claim 1, further comprising a first optical aid layer and a second optical aid layer arranged on the hole transporting layer and respectively formed to correspond to the red sub pixel area Rp and the green sub pixel area Gp.

4. The light emitting device of claim 2, wherein a Lowest Unoccupied Molecular Orbital (LUMO) energy level of the third phosphor host material has a value between a LUMO energy level of the first phosphor host material and a LUMO energy level of the second phosphor host material.

5. The light emitting device of claim 2, wherein a Highest Occupied Molecular Orbital (HOMO) energy level of the third phosphor host material has a value about the same as a HOMO energy level of the second phosphor material.

6. A light emitting device comprising:
a first electrode and a second electrode; and
an organic light-emission layer (EML) having a red emission layer, a green emission layer, and a blue emission layer between the first electrode and the second electrode,
wherein at least one of the red emission layer, the green emission layer, and the blue emission layer emits a baseline amount of light, and further includes a plurality of organic materials generating an exciplex state of energy in an exciplex state, the plurality of organic materials emitting additional amount of light above the baseline amount of light in the exciplex state due to energy corresponding to differences of different energy levels of different kinds of the plurality of organic materials.

7. The light emitting device of claim 6, wherein the plurality of organic materials include a phosphor host material, a second phosphor host material, and a dopant material.

8. The light emitting device of claim 7, wherein the phosphor host material has a pre-mixed state of a first phosphor host material and a third phosphor host material having a band gap wider than those of the first phosphor host material and the second phosphor host material.

9. The light emitting device of claim 8, wherein a triplet energy level of the first phosphor host material and the third phosphor material, and a triplet energy level of the second phosphor host material have a difference.

10. The light emitting device of claim 9, wherein the difference is 0.04 eV to 0.1 eV.

11. The light emitting device of claim 7, wherein a Lowest Unoccupied Molecular Orbital (LUMO) energy level of the third phosphor host material has a value between a LUMO energy level of the first phosphor host material and a LUMO energy level of the second phosphor host material.

12. The light emitting device of claim 7, wherein a Highest Occupied Molecular Orbital (HOMO) energy level of the third phosphor host material has a value about the same as a HOMO energy level of the second phosphor material.

13. The light emitting device of claim 6, wherein the exciplex state is formed in the green emission layer.

14. The light emitting device of claim 13, wherein the green emission layer has a thickness of 200 Å to 500 Å.

15. The light emitting device of claim 13, wherein the phosphor dopant in the green emission layer is at a concentration level of 3 to 20%.

16. The light emitting device of claim 13, wherein the green emission layer includes phosphor materials selected from TCTA (Tris(4-carbazoy-9-ylphenyl)amine), CBP (4,4'-Bis(N-carbazolyl)-1,1'-biphenyl), Balq (Bis(8-hydroxy-2-methylquinoline)-(4-phenylphenoxy)aluminum) and PPV (poly(p phenylene vinylene)), as host materials.

17. The light emitting device of claim 13, wherein the dopant includes Ir complex containing Ir(ppy)3 or Ir(m-mapy)3.

18. A method of manufacturing a light emitting device, the method comprising:
 forming an emission layer having an exciplex material by:
  depositing a phosphor host material from a first deposition source onto a substrate;
  depositing a second phosphor host material from a second deposition source onto the substrate; and
  depositing a dopant material from a third deposition source onto the substrate, wherein the depositing of the phosphor host material, the second phosphor material and the dopant material occur simultaneously using a thermal evaporation method.

19. The method of claim 18, wherein the phosphor host material includes a first phosphor host material and a third phosphor host material, which are formed in a pre-mixed state, and
 wherein the third phosphor host material has a band gap wider than those of the first phosphor host material and the second phosphor host material.

20. An organic light emitting layer comprising:
 a phosphor-based emission layer including a wide band gap material configured for exciplex generation that results in increased emission efficiency and reduced power consumption when compared to a conventional phosphor-based emission layer that lacks the wide band gap material,
 wherein the phosphor-based emission layer includes a first phosphor host material, a second phosphor host material and a third phosphor host material, wherein the third phosphor host material is made of a wide band gap material.

21. The organic light emitting layer of claim 20, wherein the third phosphor host material has a LUMO level between a LUMO level of the first phosphor host material and a LUMO level of the second phosphor host material.

22. The organic light emitting layer of claim 21, wherein a triplet energy level T1 of each of the first phosphor host material and the third phosphor host material have a difference 0.04 eV to 0.1 eV as compared with a triplet energy level T1 of the second phosphor host material.

23. The organic light emitting layer of claim 20, wherein the first phosphor host material and the third phosphor host material are pre-mixed with each other.

* * * * *